United States Patent [19]

Butters et al.

[11] Patent Number: 4,711,834

[45] Date of Patent: * Dec. 8, 1987

[54] LASER-IMAGEABLE ASSEMBLY AND PROCESS FOR PRODUCTION THEREOF

[75] Inventors: Alan Butters, Ipswich; Roger N. Barker, Clacton-on-Sea; Stuart C. Rennison, Hadleigh Nr Ipswich, all of England

[73] Assignee: Imperial Chemical Industries PLC, London, England

[*] Notice: The portion of the term of this patent subsequent to Dec. 2, 2003 has been disclaimed.

[21] Appl. No.: 721,183

[22] Filed: Apr. 8, 1985

[30] Foreign Application Priority Data

Apr. 25, 1984 [GB] United Kingdom ............... 8410515

[51] Int. Cl.$^4$ .......................... G03C 1/72; G03F 1/00; G03F 7/10
[52] U.S. Cl. ..................................... 430/201; 430/271; 430/273; 430/300; 430/302; 430/347; 430/945; 430/964
[58] Field of Search ............... 430/201, 346, 945, 964, 430/270, 271, 273, 300, 302, 5, 322; 346/766, 135.1

[56] References Cited

U.S. PATENT DOCUMENTS

| | | | |
|---|---|---|---|
| 3,787,210 | 1/1974 | Roberts | 430/945 |
| 3,945,318 | 3/1976 | Landsman | 430/201 |
| 3,962,513 | 6/1976 | Eames | 430/945 |
| 3,964,389 | 6/1976 | Peterson | 430/945 |
| 4,004,924 | 1/1977 | Vrancken et al. | 430/201 |
| 4,064,205 | 12/1977 | Landsman | 430/201 |
| 4,245,003 | 1/1981 | Oransky et al. | 430/945 |
| 4,412,231 | 10/1983 | Namba et al. | 430/964 |
| 4,626,493 | 12/1986 | Butters et al. | 430/964 |

*Primary Examiner*—Richard L. Schilling
*Attorney, Agent, or Firm*—Cushman, Darby & Cushman

[57] ABSTRACT

A laser-imageable assembly comprising a transparent substrate and an associated energy absorbent transfer layer comprising particles which absorb laser energy dispersed in a resin, the assembly comprising at least one further layer selected from
(a) an intermediate priming layer,
(b) a protective coating layer, and
(c) a lubricant coating layer.

The transfer layer is preferably rendered heterogeneous - for example, by appropriately drying the coated substrate.

A preferred substrate is a polyester film.

9 Claims, No Drawings

LASER-IMAGEABLE ASSEMBLY AND PROCESS FOR PRODUCTION THEREOF

This invention relates to a laser-imageable assembly, to a method for the production thereof, and to a method for the production of a printing plate therefrom.

Laser-imageable assemblies are known in the art and generally comprise a transparent film substrate having on a surface thereof an energy absorbent transfer layer. Exposure of such an assembly to a laser beam directed through the transparent substrate, and focused at the interface between the substrate and transfer layer, results in the laser-struck portions of the transfer layer being displaced from the substrate to create a relatively clear pattern thereon.

If the exposure is conducted with the transfer layer of the assembly in intimate contact with the surface of a printing plate former, such as a grained, anodised aluminium plate, the displaced portions of the transfer layer adhere to the printing plate former and constitute an image pattern thereon. The residual exposed assembly constitutes a negative transparent master of the image produced by the laser beam and may be used for imaging photopolymer printing plates.

Generally, the transfer layer comprises a cross-linkable polymeric binder, whereby the image pattern transferred to a printing plate former may be rendered durable, for example—by heating to effect cross-linking of the transferred pattern.

An acceptable laser-imageable assembly must satisfy several apparently conflicting criteria. Thus, the bond between the film substrate and transfer layer should be sufficiently strong to prevent accidental displacement of the transfer layer during handling of the assembly, and the material of the transfer layer must be durable and compatible with the receptive surface of a printing plate former. At the same time, the transfer layer must be readily separated from the film substrate to facilitate production of a negative transparent master with a clear image pattern.

U.S. Pat. No. 3,964,389 discloses a method of making an imaged printing plate using a transparent substrate coated with (a) particles which absorb laser energy, (b) a self-oxidizing binder, and (c) a cross-linking agent or a cross-linking agent in combination with a cross-linkable resin. Carbon black particles are dispersed in the coating to absorb laser energy. However, although the coating can be transferred to a lithographic printing surface by exposure to a laser beam of acceptable power, a residue of the coating layer tends to remain on the exposed area of the substrate rendering the latter unsuitable for use as a negative master. An undesirable increase in laser power is required to effect adequate removal of coating layer from the exposed area.

U.S. Pat. No. 4,245,003 has therefore proposed the use of a laser-imageable member comprising a transparent film having thereon a dried, uniform coating comprising graphite particles and a non-self-oxidising binder in sufficient quantity to prevent removal of the coating under normal handling conditions. However, such members have been observed to suffer partial detachment of the coating layer when placed in repeated contact with a dry photopolymer plate under vacuum and then separated.

We have now devised an improved assembly which eliminates or substantially overcomes these defects.

Accordingly, the present invention provides a multiple-layer laser-imageable assembly comprising a transparent substrate and an associated energy absorbent transfer layer comprising particles which absorb laser energy dispersed in a resin wherein the assembly comprises at least one further layer selected from (a) an intermediate priming layer between the substrate and transfer layer
(b) a protective coating layer on a surface of the transfer layer remote from the substrate, and
(c) a lubricant coating layer remote from the substrate The invention further provides a method of making a multiple layer laser-imageable assembly comprising applying to a transparent substrate sequential layers of flowable coating media and drying each applied layer of coating medium before applying a subsequent flowable layer, wherein the sequentially applied layers comprise a transfer layer associated with the substrate and comprising laser energy absorbent particles dispersed in a resin binder, and at least one further layer selected from (a) an intermediate priming layer between the substrate and transfer layer,
(b) a protective coating layer on a surface of the transfer layer remote from the substrate, and
(c) a lubricant coating layer remote from the substrate In a preferred embodiment of the invention the applied, and dried, transfer layer is of a heterogeneous nature. Formation of a heterogeneous transfer layer is suitably achieved by drying the applied energy absorbent transfer medium, (1) at a sufficiently low temperature, and optionally,
(2) in the presence of a non-solvent for the resin binder, to develop a hetereogeneous resin transfer layer associated with the substrate.

The invention is hereinafter described in terms of a heterogeneous transfer layer, although it will be appreciated that the transfer layer may be homogeneous, homogeneity being achieved, for example—by drying the applied flowable transfer medium at a relatively high temperature and/or in the absence of a non-solvent for the resin binder.

By a hetereogeneous resin layer is meant a resin layer of non-uniform composition with respect to the resin. In effect, the resin transfer layer is discontinuous and the discontinuities therein may manifest themselves as cracks or crazing in the outermost surface (remote from the substrate) of the resin layer, or as gaps between discrete particles or agglomerates of the resin. Alternatively, the resin layer may comprise an open-cell, voided structure.

The heterogeneous transfer layer is generally of a blushed or matt appearance, and the light scattering characteristics thereof provide a convenient means of assessing the degree of heterogeneity. Desirably, the heterogeneous transfer layer exhibits a Gardner Gloss (45°) of less than about 50%, and preferably less than about 10%.

Binder resins suitable for use in forming the transfer layer include self-oxidising binders, such as nitrocellulose, and non-self-oxidising binders, such as ethylcellulose and polyacrylic acid (especially the alkali metal salts thereof, e.g. sodium or potassium salts). Desirably, the selected binder resin, when dried to form the transfer layer, should be insoluble in hydroxyethylmethacrylate to facilitate the use of the transfer assembly in the production of dry photopolymer printing plates.

The resin binder is desirably applied to the substrate (or primer layer) as a dispersion or solution in a volatile vehicle as hereinafter described, in anamount which will yield a dry transfer layer having a thickness of from 0.5 to 5 microns, particularly from 1 to 3 microns. The optical density, i.e. $\log_{10}(I_i/I_t)$, where $I_i$ is the intensity of the incident light, and $I_t$ is the intensity of the transmitted light, of the resultant laser-imageable assembly is typically from about 2.0 to 3.5, particularly from 2.5 to 3.0, density units, as measured by a McBeth Densitometer (Model TD 528) using a Wratten 18A filter.

Energy absorbing particles suitable for inclusion in the transfer layer include any material, such as a pigment, having a broad absorption band embracing the visible and ultra-violet spectrum, and in particular carbon black and graphite, the latter being preferred. Such particles suitably have a mean diameter of from 1 to 15 microns, preferably from 3 to 7 microns.

Energy absorbing particles are conveniently employed in the binder resin in an amount such that the weight ratio of particles to binder resin is from 10:1 to 1:2, preferably from 5:1 to 2:1.

The resin transfer layer may be applied by conventional coating techniques. For example, a suspension of the energy absorbing particles in resin binder diluted to an appropriate viscosity in a voatile vehicle such as an organic diluent, may be deposited on the substrate (or primer layer) and spread thereon by a Meier bar, or applied by a roller coating technique. Suitable organic diluents include iso-propanol, ethanol or methyl ethyl ketone, and mixtures thereof—for example a mixture of methylethylketone and ethanol (3:1 v/v). Drying of the applied resin coating is effected in conventional drying equipment, such as an air oven. Drying may be effected at a relatively high temperature to yield a homogeneous transfer layer. Alternatively, and preferably, drying may be effected at a sufficiently low temperature, for example less than 70° C. and preferably from 60° to 40° C., generally at about or below 50° C., to develop the desired heterogeneous structure in the transfer layer.

Development of the desired heterogeneous structure is assisted by effecting the drying in the presence of a non-solvent for the resin binder component. Desirably, the non-solvent is a material of relatively high boiling point, particularly one of higher boiling point than the volatile vehicle. Water is a particularly suitable non-solvent.

A relatively small amount of the non-solvent, for example—not exceeding 10% and conveniently less than 5%, by volume of the applied coating medium (resin plus diluent) achieves the desired effect. For example, 60 mls of water may be blended with 4 liters of coating medium, i.e. 1.5% v/v, prior to deposition of the coating medium onto the (primed) substrate.

Durability of an assembly according to the invention, particularly with respect to chemical resistance of the transfer layer may be improved, if desired, by inclusion in the transfer layer of a cross-linking agent for the binder resin, optionally in the presence of an additional cross-linkable polymeric resin. Cross-linking of the transfer layer may be effected by conventional techniques—for example, by heating the applied transfer coating during the aforementioned drying operation.

The substrate (primed, if desired) on which the transfer layer is deposited may comprise any suitable polymeric material, particularly in the form of a self supporting transparent film or sheet. Suitable polymeric materials include cellulose esters, e.g. cellulose acetate, polystyrene, polyamides, polymers and copolymers of vinyl chloride, polymers and copolymers of olefines, e.g. polypropylene, polysulphones, polycarbonates and particularly linear polyester which may be obtained by condensing one or more dicarboxylic acids or their lower alkyl diesters, e.g. terephthalic acid, isophthalic acid, phthalic acid, 2-5, 2,6- and 2,7-naphthalene dicarboxylic acid, succinic acid, sebacic acid, adipic acid, azelaic acid, diphenyl dicarboxylic acid and hexahydroterephthalic acid or bis-p-carboxyl phenoxy ethane, optionally with a mono-carboxylic acid, such as pivalic acid, with one or more glycols, e.g. ethylene glycol, 1,3-propanediol, 1,4-butanediol, neopentyl glycol and 1,4-cyclohexane-dimethanol. A biaxially oriented and heat-set film of polyethylene terephtalate is particularly useful for the production of an assembly according to the invention and may be produced by any of the processes known in the art, e.g. as described in British patent specification No. 838 708.

The polymer substrate is suitably of a thickness from 25 to 250, particularly from 50 to 175 and especially about 75 microns.

Performance of an assembly according to the invention may be improved, if desired, by the inclusion of an intermediate priming layer between the substrate and transfer layer. Creation of a priming layer is conveniently effected by treating the surface of the polymer substrate with an agent known in the art to have a solvent or swelling action on the substrate polymer. Examples of such agents, which are particularly suitable for the treatment of a polyester substrate, include a halogenated phenol dissolved in a common organic solvent e.g. a solution of p-chloro-m-cresol, 2,4-dichlorophenol, 2,4,5, or 2,4,6-trichlorophenol or 4-chlororesorcinol in acetone or methanol. In addition, and preferably, the priming solution may contain a partially hydrolysed vinyl chloride/vinyl acetate copolymer. Such a copolymer conveniently contains from 60 to 98 per cent of vinyl chloride, and from 0.5 to 3% of hydroxyl units, by weight of the copolymer. The molecular weight (number average) of the copolymer is conveniently in a range of from 10,000 to 30,000, and preferably from 16,500 to 25,000.

The priming agent is suitably applied at a concentration level which will yield a priming layer having a relatively thin dry coat thickness—for example, generally less than 2 microns, and preferably, less than 1 micron.

If desired, a protective medium, such as a small amount of an incompatible polymer, may be deposited on the applied transfer layer to prevent or reduce coalescence thereof thereby to enhance the durability and chemical resistance of the transfer layer. A suitable protective medium comprises a hydrophilic polymer, such as the condensation product of formaldehyde with the sodium salt of naphthalene sulphonic acid, and may be deposited from solution or dispersion in a suitable volatile medium, which is subsequently removed by drying, to form a hydrophilic protective coating on the surface components of the transfer layer. If, as preferred, the dried transfer layer is of a discontinuous, heterogeneous nature, the subsequently applied protective coating may not form a coherent continuous layer and may, in fact, exhibit discontinuities.

To ensure effective protection, the protective coating medium may include a surfactant to facilitate uniform spreading of the coating medium over the surface of the transfer layer and penetration into the discontinuities in a heterogenous transfer surface. Conventional surfactants may be employed, particularly a cationic surfactant, such as stearamidopropyldimethyl-hydroxylethylammoniumdihydrogen phosphate.

If desired, the protective coating medium may also contain a catalyst to promote cross-linking of the binder resin and/or additional cross-linkable resin present in the transfer layer. A suitable catalyst comprises p-toluene sulphonic acid.

The thickness of the applied protective coating should be such, after drying, as will provide the requisite degree of protection. In general, the protective coating desirably exhibits a dry coat thickness of at least 0.05 micron, and preferably from 0.1 to 0.5 micron.

An assembly according to the invention may additionally comprise a lubricant layer on a surface remote from the substrate. Thus, the lubricant layer may be deposited directly onto the remote surface of the transfer layer, or, if a protective hydrophilic coating has been applied, a lubricant layer may be deposited onto the remote surface of the hydrophilic coating.

The lubricant layer may suitably comprise a wax, for example paraffin wax, particularly a paraffin wax having a clearing point of from 60° to 70° C. A wax lubricant layer of this kind improves the cold strength of the assembly, reduces frictional contact thereby reducing the risk of damage during handling and processing of the assembly, improves the transfer characteristics of the assembly and confers improved resistance to attack by chemical species—such as, hydroxyethylmethacrylate.

Each of the aforementioned layers—priming, protective and lubricant—contributes to the performance of the assembly and, according to a preferred embodiment of the invention a laser-imageable assembly therefore comprises a multi-layer structure comprising
  (1) a transparent substrate, and applied in sequence outwardly from said substrate,
  (2) a primer layer,
  (3) an energy absorbent transfer layer,
  (4) a protective coating layer, and
  (5) a lubricant coating layer, each of the layers being as herein defined An assembly according to the invention is suitable for use with a conventional laser—for example, of the solid type, such as a ruby crystal rod laser which emits a powerful and narrow beam of red light in ultra-short pulses, or of the gaseous type, such as a pulsed or continuous wave $CO_2$ laser, or a helium-neon laser in which the gas mixture is excited by a radio-frequency generator to produce a continuous energy beam. In general the laser beam employed should be selected to have a wave length short enough to deliver an adequate supply of energy to the target area. A preferred laser is therefore one which produces wave lengths in the infra-red region—such as a YAG (yttrium-aluminium-garnet) laser which has an effective wave length of about 1.06 microns, or an argon laser which has an effective wave length of from about 0.48 to about 0.52 micron.

An assembly according to the invention may be employed to produce an imaged printing plate by placing the coated surface of the assembly in intimate contact with a surface of a printing plate former, directing a laser beam image pattern through the transparent substrate of the assembly to transfer a portion of the coated surface corresponding to the image pattern from the substrate to the surface of the printing plate former and, optionally, effecting cross-linking of the transferred portion.

An assembly according to the invention may be imaged by a laser beam to produce a negative transparent master of the image generated by the laser beam. The negative transparent master may be employed as a graphics intermediate in the production of an imaged photopolymer printing plate. Thus, an imaged photopolymer printing plate may be produced by directing a laser beam image pattern through the transparent substrate of an assembly to produce a negative transparent master comprising an assembly from which an image portion of the transfer layer has been displaced, placing the imaged master in contact with the photopolymerisable surface of a photopolymer printing plate former, directing actinic radiation through the master to irradiate an image portion of the photopolymerisable surface, and processing the irradiated surface by known technique(s) to yield a photopolymer printing plate.

The invention is illustrated by reference to the following Examples.

EXAMPLE 1

A laser-imageable assembly was prepared as follows:
(a) Substrate

A biaxially oriented, uncoated, polyethylene terephthalate film of 75 microns thickness was employed as the transparent substrate.

(b) Priming Layer

One surface of the substrate was coated with a solution in acetone of p-chloro-m-cresol (3.75% weight/vol) and VINYLITE VAGH (0.75% weight/vol), VINYLITE VAGH is a copolymer of vinylchloride (90 wt %) and vinyl acetate (4 wt %) with 2.3 wt % hydroxyl content and of average molecular weight 23,000.

The primed substrate was then dried in a hot air oven maintained at a temperature of 80° C. to leave a residual prime layer of approximately 0.2 micron thickness.

(c) Transfer layer (Homogeneous)

A dispersion of the following composition was applied to the primed substrate by a roller coating technique:
DAG 580 200 ml
Cymel 300 0.3 g
Methylethylketone 600 ml
p-toluene sulphonic acid 0.17 g DAG 580 (Acheson Colloids) comprises about 18 parts by weight of graphite particles average particle size about 5 microns dispersed in about 4 parts by weight of ethylcellulose dissolved in about 77 parts by weight of ethanol.

Cymel 300 is a hexamethoxymethylmelamine cross-linking agent supplied by American Cyanamid Co.

The p-toluene sulphonic acid serves as a cross-linking catalyst.

The coated substrate was dried in a hot air oven at a relatively high temperature (110° C.) to yield an assembly with a homogeneous cross-linked transfer layer. The assembly had an Optical Density of about 2.6 density units (Mc Beth Densitometer TD528/Wratten 18 A filter).

The assembly was imaged using a DAYTREX 760 laser plate maker supplied by Crosfield Electronics Ltd and comprising a transparent cylindrical drum of 1.9 meters circumference within which was located a YAG laser. The assembly was clamped with the transparent substrate in contact with the outer surface of the drum and with a paper receptor sheet against the outermost transfer layer. The laser was operated at a continuous power rating of 12 watts to produce a laser beam of wavelength 1.06 microns and spot size of 25 microns, while the drum rotated at a speed of 50 rps, i.e. a peripheral velocity of 95 ms$^{-1}$.

The minimum optical density (Dmin) of the imaged portion of the resultant exposed assembly was 0.99 density units, and it was evident from visual inspection that a significant amount of graphite particles remaind attached to the substrate in the image area. This behaviour illustrates the difficulty of displacing a chemically-resistant transfer layer from a substrate to a receptor sheet.

EXAMPLE 2

The procedure of Example 1 was repeated save that drying of the transfer dispersion was effected at a relatively low temperature (65° C.) to yield an assembly with a heterogeneous transfer layer, the assembly having a generally matt appearance and Optical Density of about 2.6 density units. When laser-imaged as described in Example 1, the imaged area of the assembly although of speckled appearance—indicating incomplete transfer of the graphite layer, had a $D_{min}$ of 0.18 density units. A considerable improvement in transfer behaviour was therefore achieved by virtue of the heterogeneous nature of the transfer layer.

EXAMPLE 3

The procedure of Example 2 was repeated save that:
(1) the dispersion applied to form a transfer layer did not contain a cross-linking catalyst,
(2) in addition to being effected at a relatively low temperature (65° C.), drying of the applied transfer dispersion was effected in the presence of a non-solvent (15 parts by weight of water in the transfer dispersion) to yield a heterogeneous transfer layer, and
(3) a protective coating was applied by roller coating to the dry transfer layer from a dispersion comprising:
Latamol 0.4 g
p-toluene sulphonic acid 0.17 g
Cationic SP 0.02 g
Methanol 65 ml
Acetone 20 ml
Distilled water 15 ml
Latamol (supplied by BASF) is a condensate of formaldehyde with a sodium salt of naphthalene sulphonic acid.

Cationic SP (supplied by Cyanamid) is a quaternary ammonium surfactant.

The p-toluene sulphonic acid which serves as a cross-linking catalyst, was thus present in the protective coating rather than in the transfer layer.

The protective coating on the assembly was dried in an air oven at a temperature of 80° C. to yield an assembly having a protective coat thickness of about 0.1 micron.

The assembly had an Optical Density of about 2.6 density units, and when laser-imaged as described in Example 1, the imaged area had a Dmin of about 0.18 density units. However, visual inspection revealed that the imaged area was not speckled and was relatively free from isolated specks of transfer coating. The imaged assembly was therefore visually attractive and more readily acceptable than that of Example 2.

EXAMPLE 4

The procedure of Example 3 was repeated save that, in addition, a lubricant coating was applied by roller to the protective layer from a solution comprising
Paraffin wax (clearing point 65° C.) 1.0 pbw
Trichloroethylene 99.0 pbw
The lubricant-coated assembly was dried in an air oven at a temperature of 40° C. to provide a lubricant coating of about 0.1 micron thickness.

The resultant assembly had an Optical Density and $D_{min}$ similar to the assembly of Example 3, but visual inspection established that the imaged area of an assembly exposed to a laser, as described in Example 1, comprised still fewer isolated spots of the transfer coating. In addition to the improved appearance, the assembly proved to be more durable and resistant to damage during haandling and processing by virtue of the wax lubricant top coating.

The laser-imaged assembly was employed as a graphic arts intermediate in the production of a photopolymer printing plate. When placed repeatedly in vacuum contact with the surface of a dry photopolymer plate former, of the 'Nyloprint' type supplied by BASF, and repeatedly exposed to UV radiation, there was no evidence of liftoff of the transfer layer from the assembly. The assembly was therefore of particular utility in the production of dry photopolymer printing plates.

We claim:

1. A multiple-layer laser-imageable assembly comprising a transparent substrate and an associated energy absorbent transfer layer comprising particles which absorb laser energy dispersed in a heterogeneous resin layer having physical discontinuities in the outermost surface and wherein the assembly comprises at least one further layer selected from
    (a) an intermediate priming layer between the substrate and transfer layer,
    (b) a hydrophilic protective coating layer on a surface of the transfer layer remote from the substrate, and
    (c) a lubricant coating layer remote from the substrate.

2. An assembly according to claim 1 wherein the particles are graphite particles.

3. An assembly according to claim 1 wherein the transfer surface of the assembly exhibits a Gardner Gloss (45°) of less than 50%.

4. An assembly according to claim 1 wherein the protective coating layer remote from the substrate comprises a hydrophilic polymer.

5. An assembly according to claim 1 wherein the substrate is a polyester film.

6. An assembly according to claim 5 wherein the substrate is a biaxially oriented polyethylene terephthalate film.

7. A method of making a multiple layer laser-imageable assembly comprising applying to a transparent substrate sequential layers of flowable coating media and drying each applied layer of coating medium before applying a subsequent flowable layer, wherein the sequentially applied layers comprise a transfer layer associated with the substrate, said transfer layer comprising laser energy absorbent particles dispersed in a heterogeneous resin binder layer having physical discontinuities in the outermost surfaces, and at least one further layer selected from:

(a) an intermediate priming layer between the substrate and transfer layer,
(b) a hydrophilic protective coating layer on a surface of the transfer layer remote from the substrate, and
(c) a lubricant coating layer remote from the substrate, the applied energy absorbent transfer medium being dried
(1) at a sufficiently low temperature, and optionally,
(2) in the presence of a non-solvent for the resin binder, to develop a heterogeneous resin transfer layer associated with the substrate.

8. A method of making an imaged printing plate by placing the coated surface of an assembly according to claim 1, or made according to claim 7, in intimate contact with a surface of a printing plate former and directing a laser beam image pattern through the transparent substrate of the assembly to transfer a portion of the coated surface corresponding to the image pattern from the substrate to the printing surface, then, optionally, effecting cross-linking of the transferred portion.

9. A method of making an imaged photopolymer printing plate by directing a laser beam image pattern through the transparent substrate of an assembly according to claim 1, or made according to claim 7, to produce a negative transparent master comprising an assembly from which an image portion of the transfer layer has been displaced, placing the imaged master in contact with the photopolymerisable surface of a photopolymer printing plate former, directing actinic radiation through the master to irradiate an image portion of the photopolymerisable surface, and processing the irradiated surface by known technique(s) to yield a photopolymer printing plate.

* * * * *